United States Patent [19]  [11] 4,065,734
Takeno et al.  [45] Dec. 27, 1977

[54] ELASTIC SURFACE WAVE DEVICES

[75] Inventors: Shouzo Takeno; Masao Mashita, both of Yokohama; Toshihiro Onodera, Tokyo, all of Japan

[73] Assignee: Tokyo Shibaura Electric Co., Ltd., Kawasaki, Japan

[21] Appl. No.: 705,177

[22] Filed: July 14, 1976

[30] Foreign Application Priority Data

July 14, 1975 Japan .................................. 50-85354
July 29, 1975 Japan .................................. 50-91581
Nov. 21, 1975 Japan .................................. 50-139205

[51] Int. Cl.² .......................... H03H 9/04; H03H 9/26; H03H 9/30; H01L 41/18
[52] U.S. Cl. .................................. 333/30 R; 310/345; 333/72
[58] Field of Search ................. 333/30 R, 72; 310/8.1, 310/8.2, 8.9, 9.4, 9.8; 427/100; 350/161 W; 29/25.35, 594

[56] References Cited

U.S. PATENT DOCUMENTS

| | | | |
|---|---|---|---|
| 3,655,429 | 4/1972 | DeKlerk | 427/100 |
| 3,760,299 | 9/1973 | Vasile | 333/30 R |
| 3,965,444 | 6/1976 | Willingham et al. | 333/30 R |

OTHER PUBLICATIONS

Deklerk–"Multilayer Thin Film Piezoelectric Transducers" in IEEE Trans. on Sonics and Ultrasonics, vol. SU13, No. 3, Aug. 1966 (reprint); pp. 100–103.

*Primary Examiner*—Alfred E. Smith
*Assistant Examiner*—Marvin Nussbaum
*Attorney, Agent, or Firm*—Oblon, Fisher, Spivak, McClelland & Maier

[57] ABSTRACT

The elastic surface wave device comprises a piezoelectric substrate having a dielectric constant of $\epsilon_2$, a dielectric film having a dielectric constant of $\epsilon_1$ and a thickness of $h$, and deposited on the piezoelectric substrate, and an inter-digital type input-ouput transducer formed on the dielectric film. The ratio of the dielectric constants $\epsilon_1/\epsilon_2$, and a function $2\pi/\lambda \cdot h$ proportioned to the thickness of the dielectric film are selected to satisfy a condition established in a frustum shaped region bounded by coordinate points $P(\epsilon_1/\epsilon_2 = 1/5, (2\pi/\lambda)\cdot h = 0.1)$, $Q(\epsilon_1/\epsilon_2 = 1/5, (2\pi/\lambda)\cdot h = 0.00016)$, $R(\epsilon_1/\epsilon_2 = 1/500, (2\pi/\lambda)\cdot h = 0.0004)$, and $S(\epsilon_1/\epsilon_2 = 1/500, (2\pi/\lambda)\cdot h = 0.006)$ on a graph wherein the ratio $\epsilon_1/\epsilon_2$ is represented on the ordinate and the function $(2\pi/\lambda)\cdot h$ on the abscissa, where $\lambda$ represents the wavelength of the elastic surface wave. As a result, the energy of the elastic surface waves is propagated from the input transducer to the output transducer with a sufficiently large power.

7 Claims, 16 Drawing Figures

ELASTIC SURFACE WAVE DEVICES

This invention relates to an elastic surface wave device and more particularly an elastic surface wave device in which a specific dielectric substance is interposed between a piezoelectric substrate and an electrode.

In an elastic surface wave device an electrode is disposed on a piezoelectric substrate and various proposals and reports regarding this device have been made in recent years. With the development of the elastic surface wave device, applications of this device to a diffusion delay line in a radar system, PIF filter (image intermediate frequency) of a colour television receiving set, etc. are frequently reported.

One example of the elastic surface wave device is described in U.S. Pat. No. 3,760,299 comprising a film of dielectric substance, SiO, on a piezoelectric substrate consisting of lithium niobate (LiNbO$_3$), and an inter-digital type electrode disposed on the substrate.

In this elastic surface wave device where the dielectric constant of the piezoelectric substrate is high, for example, higher than several hundreds and where the operating frequency is high, for example, higher than several tens MHz the result of experiment shows that near a certain thickness of the dielectric film the electromechanical coupling decreases rapidly thus stopping propagation of the elastic surface wave so that it becomes impossible to detect an elastic surface wave signals.

For example, when a frequency of 60 MHz is used, a film of SiO a SiO$_2$ having a thickness of from $\lambda/15$ that is 2 microns to $\lambda/30$, that is 1 micron, and having a dielectric constant $\epsilon = 4$ is deposited on a LiNBO$_3$ piezoelectric substrate and when a transducer in the form an inter-digital type input-output electrode is provided to complete an elastic surface wave device it is impossible to detect the elastic surface wave at the output electrode, where $\lambda$ represents the wave length of the elastic surface wave propagating through a medium at the operating frequency. To use such elastic surface wave device in a colour television receiving set the device is required to have an excellent temperature characteristic because the temperature of the colour television receiving set varies greatly in summer and winter. However, the temperature characteristics of the LiNbO$_3$ piezoelectric substrate is very pour, for example 80 PPM. Accordingly, where this device is applied to a colour television receiving set, the center frequency of the PIF filter is caused to shift by the variation in the ambient temperature.

It is an object of this invention to provide an improved elastic surface wave device having excellent temperature characteristic and moisture proof characteristic and capable of increasing the input-output impedance.

According to this invention, there is provided an elastic surface wave device comprising a piezoelectric substrate having a dielectric constant of $\epsilon_2$, a dielectric film formed on the piezoelectric substrate and having a thickness of $h$ and a dielectric constant $\epsilon_1$, and an input-output transducer formed on the dielectric film, wherein the ratio of the dielectric constant $\epsilon_1/\epsilon_2$ of the piezoelectric substrate and the dielectric film, and a function $(2\pi/\lambda)\cdot h$ proportional to the thickness of the dielectric film are selected to satisfy a condition established in a frustrum shaped region bounded by coordinate points $P(\epsilon_1/\epsilon_2 = 1/5, (2\pi/\lambda)\cdot h = 0.1)$, $Q(\epsilon_1/\epsilon_2 = 1/5, (2\pi/\lambda)\cdot h = 0.00016)$, $R(\epsilon_1/\epsilon_2 = 1/500, (2\pi/\lambda)\cdot h = 0.0004)$, and $S(\epsilon_1/\epsilon_2 = 1/500, (2\pi/\lambda)\cdot h = 0.0006)$ on a graph wherein the ratio $\epsilon_1/\epsilon_2$ is represented on the coordinate and the function on the abscissa, where $\lambda$ represents the wavelength of the elastic surface wave. Thus, the excitation of the elastic a practical device which can not only be increased in input-output impedance but is also excellent in terms of temperature and moisture resistance characteristics.

Further objects and advantages of the invention can be more fully understood from the following detailed description taken in conjunction with the accompanying drawings in which:

FIG. 1A is a perspective view, and FIG. 1B is a side view showing the outline of the elastic surface wave device embodying the invention;

FIG. 2 shows an equivalent circuit of a transducer utilized in the device shown in FIG. 1;

FIG. 3A is a diagram showing a distribution of electric field when it is impressed upon the transducer;

FIG. 3B is an equivalent circuit of the device shown in FIG. 3A;

FIG. 4 is a graph showing the relationship between the thickness of the dielectric film and the rate of decrease in the electrostatic capacitance of the first embodiment of this invention;

FIG. 5 is a graph showing the relationship between the thickness of the dielectric film and the variation in the coupling coefficient of the first embodiment;

Figures 1A, 1B, 2, 3A, 3B, 4, 5:
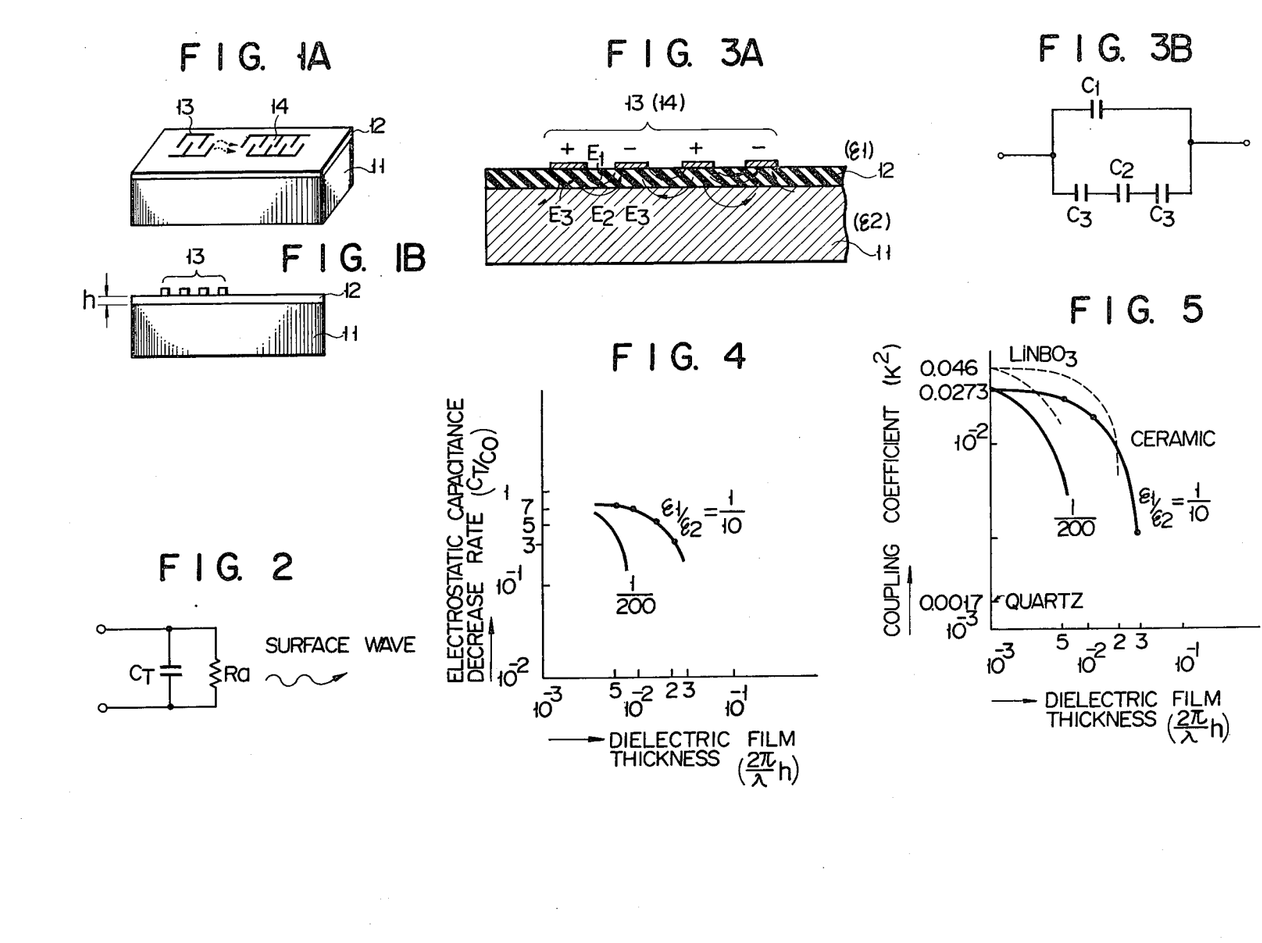

The elastic surface wave device of this invention is shown in FIGS. 1A and 1B. The elastic surface wave device 10 shown therein comprises a piezoelectric substrate 11 having a high dielectric constant, a dielectric film 12 having a lower dielectric constant than the substrate and a thickness $h$ and formed on the upper surface of the substrate 11 and a transducer in the form of interdigital type input electrode 13 and output electrode 14 formed on the dielectric film.

Denoting the electro-mechanical coupling coefficient between the piezoelectric substrate 11 and the transducer 13 and 14 of the elastic surface wave device 10 by $K^2$ the insertion loss $L_I$ caused by the intervention of the dielectric film 12 between the piezoelectric substrate and the transducer is expressed by an equation $$L_I \propto 1/K^2 \quad (1)$$

Accordingly, if the coefficient $K^2$ were too small, the insertion loss $L_I$ would increase with the result that the conversion efficiency between electric and mechanical energies of the transducer would be decreased. In an extreme case it becomes impossible to detect the converted signal by the transducer.

FIG. 2 shows an equivalent circuit of the transducer, that is the inter-digital type input electrode 13 shown in FIG. 1. Denoting the electrostatic capacitance of the inter-digital type input electrode 13 by $C_T$, the radiation resistance $Ra$ is given by the following equation.

$$Ra \propto 1/(C_T K^2) \quad (2)$$

FIG. 3A shows an electric field distribution of the device 10 when the dielectric film 12 is provided, and FIG. 3B shows an equivalent circuit of the device shown in FIG. 3A. In FIG. 3A $E_1$ shows the electric field applied across the dielectric film 12, $E_2$ the electric field across the dielectric film 12 and the dielectric substrate 11 and the dielectric film 12 and $E_3$ the electric field across the dielectric film 12 and the piezoelectric substrate 11.

Denoting the electrostatic capacitances of electrode 13, 14 by $C_1$, $C_2$ and $C_3$ when these fields are applied the electrostatic capacitance $C_T$ shown in FIG. 2 can be shown by an equation $$C_T = C_1 + (C_2 \cdot C_3/2C_2 + C_3) \quad (3)$$

where $C_1$, $C_2$ and $C_3$ represents electrostatic capacitances of the electrode created by electric fields $E_1$, $E_2$ and $E_3$ respectively.

Where the dielectric constants satisfy a relation $\epsilon_2 > \epsilon_1$, $C_1$ is generally selected to the equal to about $C_2/10$, so that $C_T < C_2$. Thus the resultant electrostatic capacitance $C_T$ where the dielectric film is provided is smaller than a case where no dielectric film is provided.

The electrostatic capacitance $C_T$, the radiation resistance $R$, and the electro-mechanical coupling coefficient $K^2$ are functions of the dielectric constant $\epsilon_2$ of the piezoelectric substrate 11, the dielectric constant $\epsilon_1$ of the dielectric film 12 and the thickness $h$ of the dielectric film 12.

We have determined various conditions which make operable the elastic surface wave device as will be described in the following embodiments.

EMBODIMENT 1

In this example, in order to obtain an operable elastic surface wave device the relationship between the dielectric constant $\epsilon_2$ of the piezoelectric substrate, the dielectric constant $\epsilon_1$ of the dielectric film, and the thickness $h$ of the dielectric film is established in a predetermined range.

Figure 6:
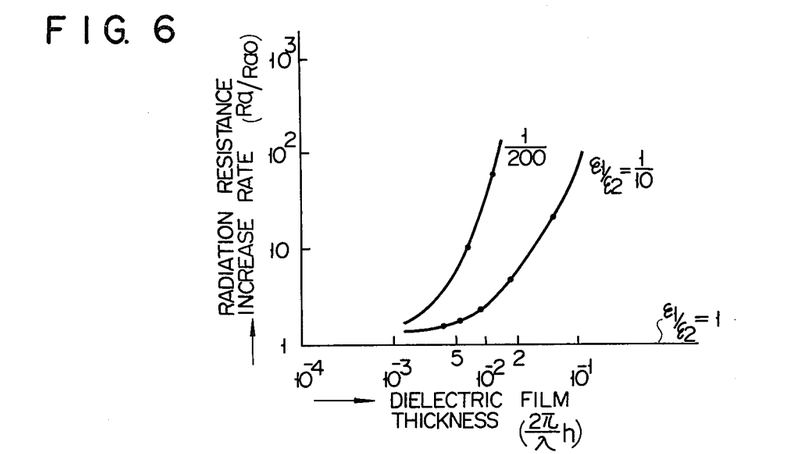
FIG. 6 is a graph showing the relationship between the thickness of the dielectric film and the rate of increase in the radiation resistance of the first embodiment.

In the construction shown in FIG. 1, lithium niobate LiNbO$_3$ and ceramic and selected as the piezoelectric substrate 11 whereas SiO, SiO$_2$, ZrO$_2$ and TiO$_2$ are used as the dielectric film 12, and various combinations of the materials for the dielectric substrate 11 and the dielectric film 12 are used. Further, a transducer in the form of inter-digital type input-output electrodes 13 and 14 are provided. The dielectric film 12 is formed on the dielectric substrate 11 by vapour deposition technique, for example. The transducer is formed by vapour depositing aluminum, for example, on the entire surface of the dielectric film 12 and the deposited film is photo-etched to form a predetermined inter-digital patterns (13 and 14 shown in FIG. 1). The relationship between the thickness $h$ of the dielectric film of various elastic surface devices prepared in a manner just described, and the coupling coefficient $K^2$, the radiation resistance Ra and the electrostatic capacitance $C_T$ expressed by equations 1, 2 and 3 respectively was investigated and obtained characteristic curves as shown in FIGS. 4, 5 and 6. The frequency used was 60 MHz and respective characteristic curves are depicted by using the ratio of dielectric constants $\epsilon_1/\epsilon_2$ as the parameter. These figures show the curves where ratio $\epsilon_1/\epsilon_2$ is 1/10 and 1/200, respectively.

FIG. 4 shows characteristic curves regarding the rate of decrease in the electrostatic capacitance $C_T/C_O$ when the thickness of the dielectric film is $(2\pi/\lambda) \cdot h$, where $C_T$ represents the electrostatic capacitance when a dielectric film is used and $C_O$ that of the case where the dielectric film is not used. As can noted from the curves, the electrostatic capacitance decreases as the film thickness $(2\pi/\lambda) \cdot h$ increases. Further, the electrostatic capacitance decreases as the parameter $\epsilon_1/\epsilon_2$ increases.

FIG. 5 shows the variation in the coupling coefficient when the film thickness $(2\pi/\lambda) \cdot h$ is increased. The solid line shows a case where the piezoelectric substrate is made of ceramic, whereas the dotted line shows a case wherein the piezoelectric substrate is made of LiNbO$_3$. For comparison, the coupling coefficient $K^2$ of a quartz piezoelectric element is also shown. As can be noted from this figure, the coupling coefficient $K^2$ is smaller in the case of ceramic than in the case of LiNbO$_3$. Further, the coupling coefficient is smaller in the case of quartz than in the case of ceramic. The coupling coefficient decreases as the film thickness increases, and the coupling coefficient $K^2$ decreases greatly when parameter $\epsilon_1/\epsilon_2$ decreases.

FIG. 6 shows curves of the rate of increase of the radiation resistance $R_a/R_{aO}$ when the film thickness $(2\pi/\lambda) \cdot h$ is increased, where $R_a$ represents the radiation resistance where no dielectric film on the substrate is used, whereas $R_{aO}$ represents the radiation resistance where the dielectric film is used. As can be noted from FIG. 6 the radiation resistance increases with the film thickness and the radiation resistance increases greatly when the parameter $\epsilon_1/\epsilon_2$ is small. As a consequence, when $\epsilon_1/\epsilon_2 = 1/10$ where the deposited film has a thickness of 1 to 2 microns the coupling coefficient $K^2$ becomes extremely small with the results that it becomes impossible to receive a surface wave.

Figure 7:
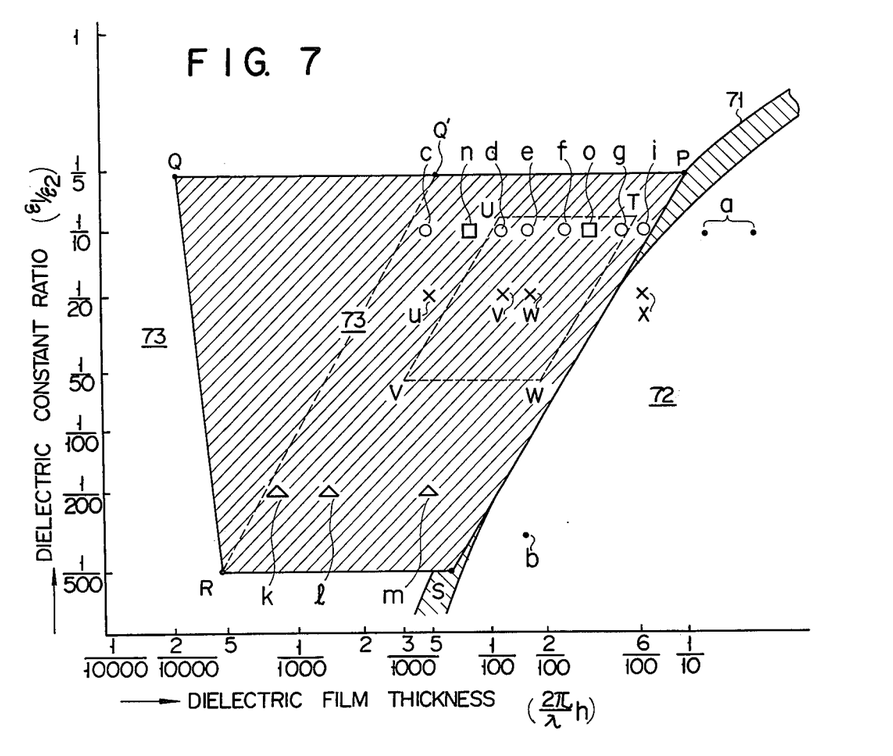
FIG. 7 is a graph showing the relationship between the thickness of the dielectric film and the ratio $\epsilon_1/\epsilon_2$ of the dielectric constants of the first embodiment, where $\epsilon_1$ and $\epsilon_2$ represent the dielectric constant of the dielectric substance and the piezoelectric substrate respectively.

From the result described above we have obtained a graph as shown in FIG. 7 in which the excitation region of the surface wave is determined by the relationship between the ratio of dielectric constants $\epsilon_1/\epsilon_2$ and the thickness of the dielectric film $(2\pi/\lambda) \cdot h$. In FIG. 7 the abscissa represents the film thickness $(2\pi/\lambda) \cdot h$ and the ordinates the ratio of the dielectric constants $\epsilon_1/\epsilon_2$. We have found that the shaded frustum shaped region bounded by points P, Q, R and S is an effective area in which excitation of the surface wave is possible. In FIG. 7, in area 72 to the right of a curved zone 71 (horizontal line portion) the coupling coefficient K² is extremely small so that it is impossible to transmit and receive the surface wave, meaning that the elastic surface device is inoperative. However, in the area 73 to the left of the curved zone 71 it is possible to sufficiently excite the surface wave device meaning that reception of the surface wave is possible.

For example, in an elastic surface wave device in which an electrode is mounted on a piezoelectric substrate made of LiNbO₃ having a relative dielectric constant of 30 to 40 via a dielectric film of silicon monooxide SiO having a relative dielectric constant of 3.5 to 4.6 when the thickness of the dielectric films is made to be 1 and 2 microns. Namely, the relationship both of the ratio of the dielectric constants and the thickness of the dielectric substrate is shown by point $a$ in FIG. 7. Since, this point $a$ is in the right hand area 72 it is impossible to receive the elastic surface wave. The frequency at this time is 60 MHz.

Where a dielectric film of silicon dioxide SiO₂ having a dielectric constant of 3.5 to 4.6 and a thickness of 1000 A (1/4000 λ) is formed on a piezoelectric substrate made of ceramics, for example [PbTiO₃ + PbZrO₃ + Pb(Cd·W)O₃ + MnO₂], and having a relative dielectric constant of 700 to 800 the ratio of dielectric constants is shown by point $b$ in FIG. 7. This point is in the right-hand area 72 so that the surface wave would not propagate even when a signal having a frequency of 60 MHz is applied to the device.

Further, in a surface wave device in which an interdigital type electrode are formed on a ceramic substrate having a relative dielectric constant of 700 to 800 through a titanium dioxide TiO₂ dielectric film having a relative dielectric constant of 40 to 50, where the thickness of the dielectric film is made to be 300 A (3/4000 λ), 700 A (7/4000 λ), 1000 A (1/400 λ), 1500 A (15/400 λ), 3000 A (3/400 λ) and 4000 A (1/100 λ) respectively, the ratios of the dielectric constants are shown by points $c$, $d$, $e$, $f$, $g$ and $i$ respectively. The ratios of the input-output impedances of this device and a device not provided with the dielectric film (that is the electrodes are formed directly on the ceramic substrate) is 1.1 for a film of 300 A, 1.2 for 700 A, 1.8 for 1000 A, 5.8 for 1500 A and 39 for 3000 A. The electrostatic capacitance for the film thickness of 1000 A decreases to 1/1.8 of that of the device not provided with the dielectric film and the coupling coefficient K² decreases to 1/1.6.

In another surface wave device in which a dielectric film of SiO₂ having a relative dielectric constant of 3.5 to 4.6 is formed on a ceramic substrate having a relative dielectric constant of 700 to 800, where the thickness of the dielectric film is varied from 50 A to 100 A and 300 A, the ratios of the dielectric constants are shown by points $k$, $l$ and $m$, respectively. Like the devices described above the devices in this case satisfactory propagate the surface wave and can increase the input-output impedance. For instance, for the dielectric film having a thickness of 50 A (5/4000 λ) the input-output impedance is increased by a factor of 1.1 when compared with that of the device not provided with the dielectric film, 3.0 for 100 A (1/4000 λ), and 14.0 for 300 A (3/4000 λ).

In still another surface wave device in which an input-output electrodes are formed on a SiO₂ dielectric film having a relative dielectric constant of 3.5 to 4.6, and formed on a LiNbO₃ piezoelectric substrate having a relative dielectric constant of 30.0 to 40.0 where the thickness of the dielectric film is made to be equal to 500 A (5/4000 λ) and 2000 A (1/200 λ) respectively, the relationship the ratios of the relative dielectric constants and the dielectric film thickness are shown by points $n$ and $o$ respectively. In this case, like the previous cases, for a film thickness of 500 A the electrostatic capacitance was decreased to 1/3.3, the coupling coefficient was decreased to 1/5, whereas the input-output impedance was increased by a factor of 1.1. For a film thickness of 2000 A, the input-output impedance was increased by a factor of 20.

Although in this embodiment, LiNbO₃ and piezoelectric ceramics were used to form the substrate, other substance such as quartz having a dielectric constant of 4 and LiTaO₃ having a dielectric constant of 30 to 40 can also be used. Also the dielectric film may be made of Ta₂O₅ having a dielectric constant of 20, ZrO₂ ($\epsilon$=40), Al₂O₂ ($\epsilon$ = 10 to 12), BeO ($\epsilon$ = 2 to 6), Cr₂O₃ ($\epsilon$ = 9.2), Ni₂O₃ ($\epsilon$ = 8.8), ZnO ($\epsilon$ = 8 to 18), Y₂O₃ ($\epsilon$ = 14) or PbO₂ ($\epsilon$ = 26).

Thus the elastic surface wave device can be fabricated by suitably combining these dielectric materials and the piezoelectric materials in a frustrum shaped region P, Q, R, S shown in FIG. 7.

FIG. 7 will now be qualitatively described. Suppose now that a combination of a piezoelectric and dielectric materials having a ratio $\epsilon_1/\epsilon_2$ of approximately 1.0 is selected. In order to increase the radiation resistance R$a$ it is necessary to increase the thickness of the dielectric film as shown in FIG. 6. However, as shown in FIG. 5 too large film thickness decreases the coupling coefficient K² of the elastic surface wave device and when the film thickness exceeds a certain limit (a value in the region to the right of the curved zone 71) the elastic surface wave device becomes inoperative.

Where a combination of the materials that decreases the ratio $\epsilon_1/\epsilon_2$ is selected it is easy to increase the radiation resistance as shown in FIG. 6 but unless the film thickness $(2\pi/\lambda)\cdot h$ is reduced extremely as shown in FIG. 5, the coupling coefficient K² would decrease rapidly thus rendering inoperative the elastic surface wave device. For this reason, thin dielectric films are advantageous, but the deposition of this films is difficult to control. For example, in a case of 5000 A (the thickness of the piezoelectric substrate) ±500 A (the thickness of the dielectric film), the control is easy but in the case of 50 A ± 50 A, the control is extremely difficult.

The region in which the ratio $\epsilon_1/\epsilon_2$ is approximately unity and the film thickness is small is a useless region in which the radiation resistance R$a$ does not vary appreciably and it is impossible to increase the impedance as shown in FIG. 6.

Summarizing the above, the frustrum shaped region bounded by points $P(\epsilon_1/\epsilon_2 = 1/5, (2\pi/\lambda)\cdot h = 0.1)$, $Q$ $(\epsilon_1/\epsilon_2 = 1/5, (2\pi/\lambda)\cdot h = 0.00016)$, $R(\epsilon_1/\epsilon_2 = 1/500, (2\pi/\lambda)\cdot h = 0.0004)$ and $S(\epsilon_1/\epsilon_2 = 1/500, (2\pi/\lambda)\cdot h = 0.006)$ is the region in which the elastic surface wave device can propagate the surface wave. It is preferred that the dielectric constant ratio $\epsilon_1/\epsilon_2$ of the dielectric substance to the piezoelectric substrate and the thickness $h$ of the dielectric film be selected within a PQRS region, that is, within a parallelepiped defined by connecting together a point $P(\epsilon_1/\epsilon_2 = 1/5, (2\pi/\lambda)\cdot h = 0.1)$, a point $Q'(\epsilon_1/\epsilon_2 = 1/5, (2\pi/\lambda)\cdot h = 0.006)$, a point $R(\epsilon_1/\epsilon_2 = 1/500, (2\pi/\lambda)\cdot h = 0.0004)$ and a point $S(\epsilon_1/\epsilon_2 = 1/500, (2\pi/\lambda)\cdot h = 0.06)$. A practical surface wave device can be obtained if a relation established by the above-mentioned parallelepiped PQRS is satisfied.

It is advantageous to select the thicknesses of the piezoelectric substrate and the dielectric film and the frequency in a region bounded by points $T(\epsilon_1/\epsilon_2 = 1/10, (2\pi/\lambda)\cdot h = 6/100)$, $U(\epsilon_1/\epsilon_2 = 1/10, (2\pi/\lambda)\cdot h = 1/100)$, $V(\epsilon_1/\epsilon_2 = 1/50, (2\pi/\lambda)\cdot h = 3/1000)$ and $W(\epsilon_1/\epsilon_2 = 1/50, (2\pi/\lambda)\cdot h = 2/100)$.

In the foregoing description the relationship between the ratio of the dielectric constants $\epsilon_1/\epsilon_2$ and the film thickness $(2\pi/\lambda)\cdot h$ that renders operative the elastic surface wave device has been clarified. Thus, it was shown that it is possible to increase the input-output impedance of the device by decreasing the ratio $\epsilon_1/\epsilon_2$, that is by using a dielectric film having a smaller dielectric constant than the piezoelectric substrate. However, it is necessary to decrease the thickness of the dielectric film correspondingly.

For example, where ceramic having a dielectric constant of 800.0 is used as the material for fabricating the piezoelectric substrate from the standpoint of low cost and coefficient of thermal expansion and where the dielectric film is made of $SiO_2$ ($\epsilon = 4$) the device is inoperative unless the film thickness is reduced below 100 A. For this reason, the elastic surface wave device is not operable unless the film thickness is reduced below 100 A. Accordingly, the device of this embodiment is not suitable for mass production because it is difficult to prepare dielectric films having small and uniform thickness. The following embodiment 2 illustrates an improved elastic surface wave device capable of increasing the thickness of the dielectric film and the input-output impedance and having an improved temperature characteristic.

We have found that the temperature characteristic and the electric signal-surface wave conversion efficiency can be improved by using ceramics as the piezoelectric substrate of the elastic surface wave device. However, as the dielectric constant of ceramics is very large (about 1.75 times) when compared with that of $LiNbO_3$ and the input-output impedance is too low when the elastic surface wave device utilizing a ceramic piezoelectric substrate is applied to a colour television circuit it is impossible to match the impedances of the input and output circuit. It was found by experiment, however, that it is possible to increase the impedance by providing a dielectric film having a predetermined thickness on the ceramic piezoelectric substrate.

EMBODIMENT 2

In this embodiment a $TiO_2$ dielectric film having a thickness of from 0.00016 λ to 0.047 λ was interposed between the ceramic piezoelectric substrate and the inter-digital type electrodes of the elastic surface wave device.

More particularly, as shown in FIG. 1, a $TiO_2$ dielectric film 12 having a thickness of from 0.00016 λ to 0.047 λ was formed on a ceramic dielectric substrate 11 having a thickness of 0.7 mm as by vapour deposition and inter-digital type input electrode 13 and output electrode 14 were formed to oppose each other to form a transducer. The $TiO_2$ film 12 may be provided between opposed portions of the input and output electrodes 13 and 14 or portions thereof. The thickness of the film 12 may not be uniform but may be graded.

FIG. 4 shows the rate of decrease in the electrostatic capacitance $C_T/C_O$ and the rate of increase in the radiation resistance $R_aIR_{ao}$ of the elastic surface wave device of this embodiment when the thickness of the $TiO_2$ film is varied, where $C_O$ represents the electrostatic capacitance of the electrodes where no $TiO_2$ film is provided, $R_a$ the radiation resistance where the $TiO_2$ film is provided, and $R_{ao}$ the radiation resistance when the $TiO_2$ film is not provided.

Figure 8:
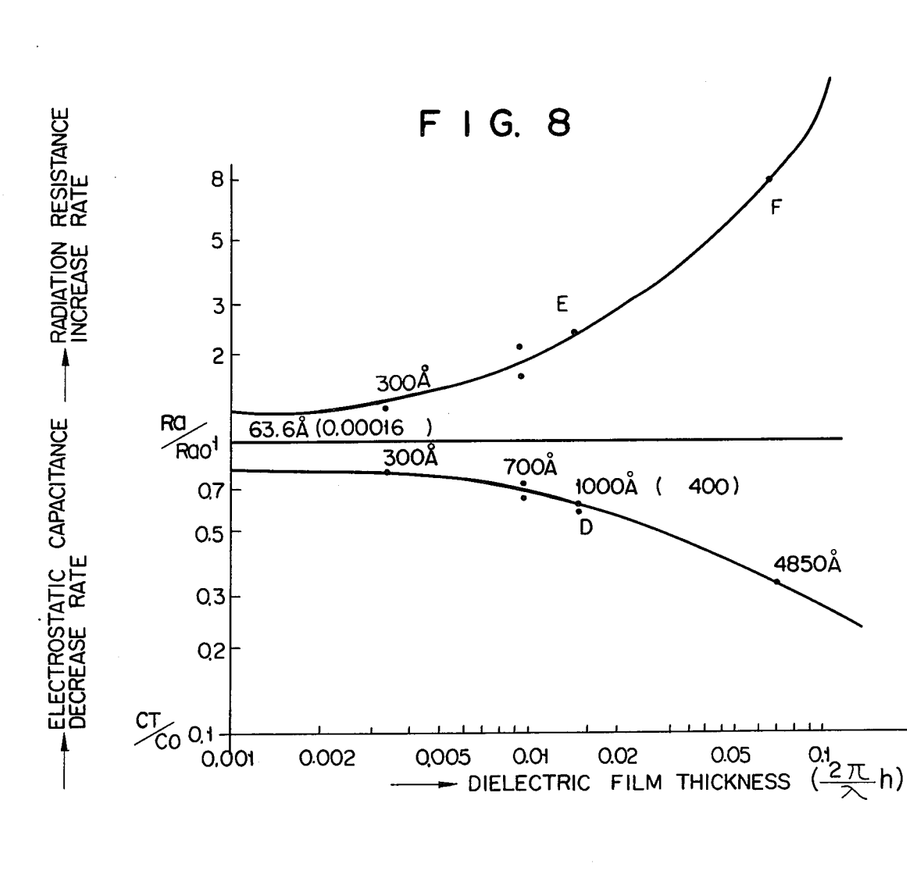
FIG. 8 is a graph showing the relationship between the thickness of the dielectric film and the rate of increase in the radiation resistance and the rate of decrease in the electrostatic capacitance of the second embodiment of this invention.

FIG. 8 is a graph showing the rate of decrease in the electrostatic capacitance and the rate of increase in the radiation resistance with reference to the film thickness $(2\pi/\lambda)\cdot h$. As can be noted from FIG. 8, the electrostatic capacitance for a $TiO_2$ film having a thickness of 1000 A (1/400 λ) has decreased to about 54% of that when no $TiO_2$ film is provided. On the other hand, the radiation resistance has increased by a factor of about 3.

Figure 9:
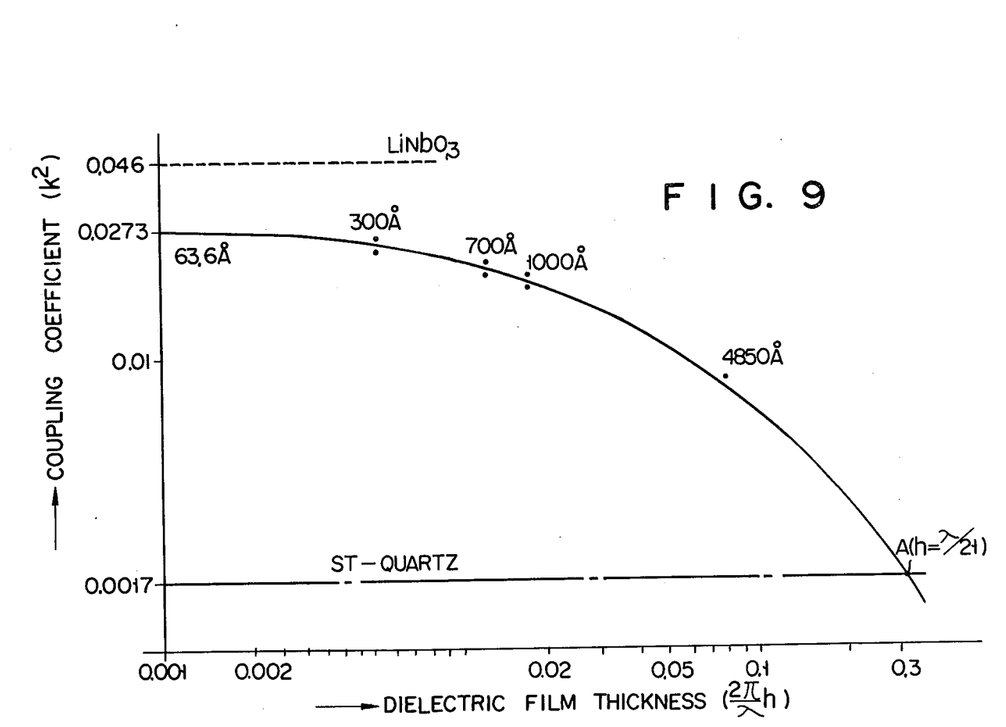
FIG. 9 is a graph showing the relationship between the thickness of the dielectric film and the coupling coefficient of the second embodiment.

Similarly, FIG. 9 shows the characteristic of the electro-mechanical coupling coefficient $K^2$ when the thickness of the $TiO_2$ film is varied. For comparison, the coupling coefficient $K^2$ of a well known elastic surface wave device including an inter-digital type electrodes formed on a piezo-electric substrate comprising a ST cut quartz plate is shown by a dot and dash line, and the coupling coefficient of a device utilizing a $LiNbO_3$ piezoelectric substrate is shown by dotted lines. The point of intersection between a curve representing the coupling coefficient for the quartz plate and that for the ceramic substrate of the embodiment 2 is denoted by point A. This point represents an elastic surface wave device provided with a $TiO_2$ film having a thickness of λ/21. From this point the electromagnetic coupling of the device begins to increase and the degradation of the frequency characteristic caused by the surface wave begins. For this reason, in order to provide a practical elastic surface wave device it is necessary to limit the thickness of the $TiO_2$ film to about λ/21 (0.047 λ). If the thickness of the $TiO_2$ film exceeds this limit, the frequency characteristic of the device greatly deteriorates for the reason described above thus becoming inoperative.

Where a transducer is formed on a ceramic piezoelectric substrate through a $TiO_2$ film as described above, it is possible to increase the input and output impedances by setting the thickness of the $TiO_2$ dielectric film in a range between 0.00016 λ and 0.047 λ. More particularly, as shown in FIG. 8, the input and output impedances are increased to about 3 times (at point D in FIG. 8) of that of the prior art device when the thickness of the $TiO_2$ film is equal to 1000 A (λ/400) and to about 8 times (point F in FIG. 8) for a thickness of 50/4800 A (0.06 λ). Although not shown in this Figure, the input and output impedances are increased greatly according to a steep curve because the rate of increase in the radiation resistance increase greatly. For example a prior art elastic surface wave device using a ceramic piezoelectric substrate has an input impedance of about 25 ohms and an output impedance of about 150 ohms. However, in order to use the elastic suface wave device in a colour television receiving set the input impedance is required to be about 200 ohms and the output impedance is required to be about 20 Kilo-ohms in order to match with the input and output circuits. For this reason, the prior art elastic surface wave device utilizing a ceramic piezoelectric substrate can not be used in a colour television receiving set but the elastic surface wave device of this embodiment can be used satisfactorily.

It was found that the input and output impedances do not increase when the thickness of the $TiO_2$ film is less than 0.00016 λ. Further, as has been pointed out before when the film thickness exceeds 0.047 λ the frequency characteristic degrades to a point not can be used practically. For the reason described above, when the thickness of the TiO₂ film of the elastic surface wave device is selected within a range between 0.00016 λ and 0.047 λ propagation of the elastic surface wave is possible. Moreover, the temperature characteristic is improved and the input and output impedances are increased.

EMBODIMENT 3

It was found that the moisture proof characteristic of the elastic surface wave device described in embodiment 2 that utilizes a TiO₂ dielectric film and that disclosed in U.S. Pat. No. 3.706,299 that utilizes a SiO₂ dielectric is poor.

Figure 10:
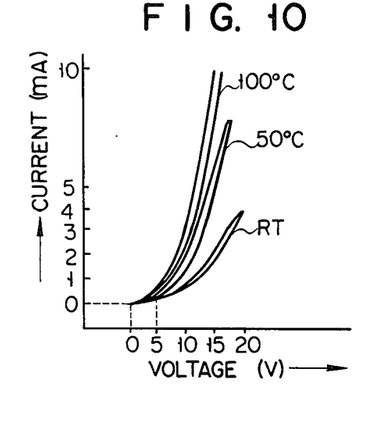
FIGS. 10 and 11 show voltage-current characteristic curves during intervals M and N respectively of the third embodiment of this invention.
Figure 11:
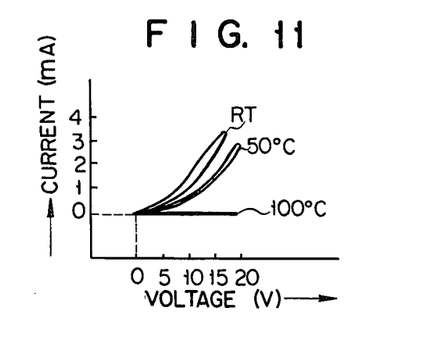
Figure 12:
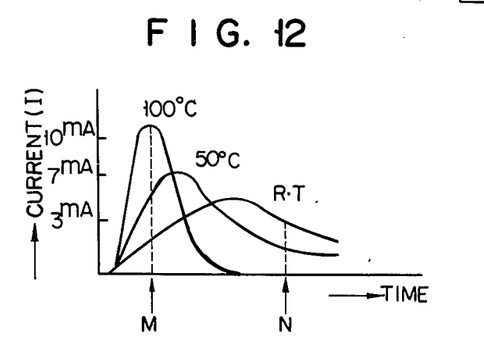
FIG. 12 is a graph in which the voltage-current characteristic curves shown in FIGS. 10 and 11 are rewritten as time-current characteristic curves.

For example, in an elastic surface wave device comprising a ceramic pirzoelectric substrate having a dielectric constant of 800, a TiO₂ dielectric film having a dielectric constant of 30 and a thickness of 2000 A(1/200 λ) overlying the entier surface of the substrate and an inter-digital type transducer including 90 pairs of electrodes having an aperture length of 1 mm, an electrode width of 8 microns and an electrode gap of 8 microns and operating at a frequency of 60 MHz has a radiation impedance of 250 ohms. However, at a relative humidity of 70%, the radiation resistance decreases to 170 ohms. FIGS. 10 and 11 show the voltage-current characteristic this device wherein the temperature is used as the parameter. From these figures it is possible to obtain a current-time characteristic as shown in FIG. 12. FIG. 10 corresponds to point M in FIG. 12 and FIG. 11 to point N in FIG. 12. When a constant voltage of 20V is impressed across opposing electrodes current does not flow initially but increases gradually with time. Further, it will be noted from FIG. 10 that the rate of current build up increases as the temperature increases. FIG. 10 shows the maximum current of the device at room temperature (RT), 50° C and 100° C respectively. The current decreases with time and at 100° C the flow of current ceases after 5 minutes. FIG. 11 show that the flow of current ceases after 10 minutes after application of the voltage at the room temperature and 50° C, respectively and after 5 minutes at a temperature of 100° C. Thus, FIG. 10 shows the result of measurement at an instant M shown in FIG. 12 while FIG. 11 that at an instant N shown in FIG. 12. When the tested device was left in an environment of high humidity and high temperature the device restored the original characteristic.

Although the theory of this phenomenon is not yet fully understood, it is pressured that is is caused by the following reason. More particularly the TiO₂ film has a large tendency of adsorbing moisture and the adsorbed moisture would ionize under applied electric field thus increasing electric conductivity. However, when heated to 100° C, for example, the adsorbed moisture evaporates with the result that the conductivity decreases or lost. After heating and drying at a temperature above 100° C and then the device was sealed in an atmosphere of dry nitrogen. Then, an impedance value same as the initial impedance was obtained, showing that an elastic surface wave device provided with a TiO₂ film should be hermetically sealed.

This embodiment is characterized in that a film consisting essentially of ZrO₂ and having a thickness of λ/100 is used as the dielectric film of the elastic surface wave device including a piezoelectric substrate, a dielectric film thereon and interdigital type electrodes formed on the dielectric film and manifesting a high input-output impedance. Thus, the device of this embodiment comprises a ceramic piezoelectric substrate, a dielectric film consisting essentially of ZrO₂ and having a thickness of 1400 A(7/2000 λ) and inter-digital type input and output electrodes formed on the dielectric film.

Figure 13:
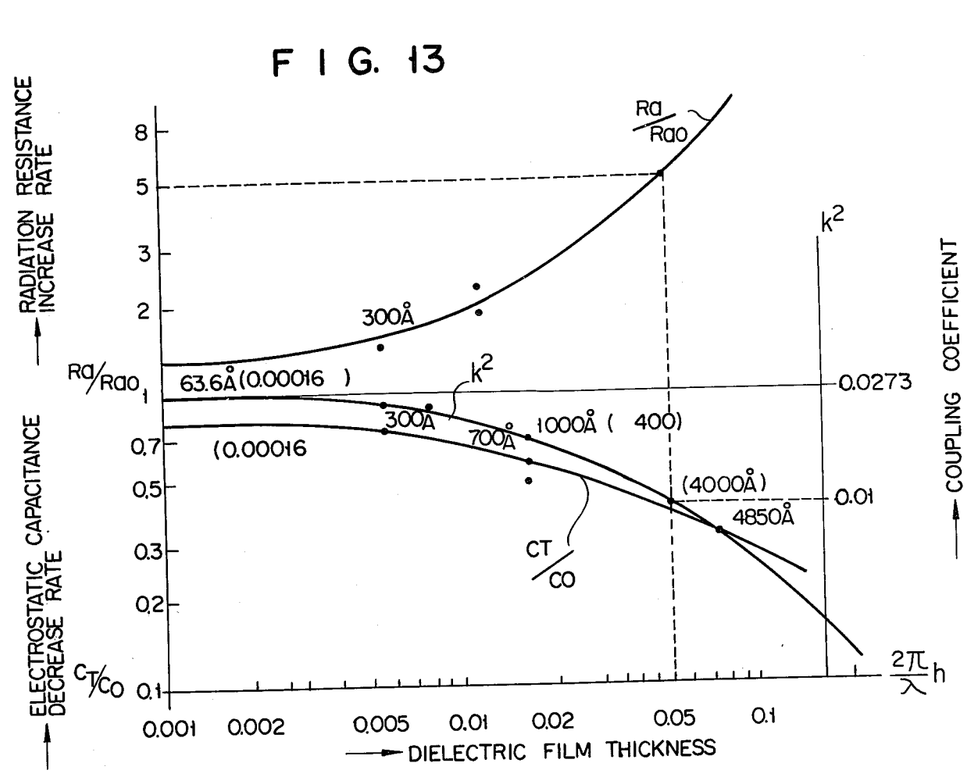
FIG. 13 is a graph showing the relationship between the thickness of the dielectric film and the coupling coefficient, the rate of increase in the radiation resistance and the rate of decrease in the electrostatic capacitance respectively of the third embodiment.

FIG. 13 shows the characteristic curves showing the rate of decrease of the electrostatic capacitance $C_T/C_O$ (where $C_T$ represents the electrostatic capacitance when the ZrO₂ film is used and $C_O$ that when the ZrO₂ film is not used), the electromechanical coupling coefficient $K^2$, and the rate of increase in the radiation resistance $C_T/Rao$ (where $Ra$ represents the radiation resistance where the ZrO₂ film is used and $Rao$ that where the ZrO₂ film is used and $Rao$ that where the ZrO₂ film is not used) of this device. As can be noted from FIG. 13, as the thickness $(2\pi/\lambda)\cdot h$ of the ZrO₂ film increases the radiation resistance $Ra$ increases but the electromechanical coupling coefficient $K^2$ decreases rapidly. As the coefficient decrease, the surface wave signal decrease and the device becomes inoperative. For example, where a device including a piezoelectric ceramic having a sound velocity of 2400 m/sec. is operated at a frequency of 60 MHz, the wavelength is equal to 40 microns meter. Where a ZrO₂ film having a thickness of 4000 A is deposited on the piezoelectric ceramic the radiation resistance increases by a factor of 5 (250 ohms) over that of the device not including the ZrO₂ film. However, the coupling coefficient $K^2$ decrease to about 0.01 thus decreasing the resulting signal. Accordingly, this value of $K^2 = 0.001$ is a limiting value for the practical elastic surface wave device. Generally speaking, where the wavelength of the elastic surface wave is denoted by λ, the film thickness should be selected to be less than λ/100 micron in order to produce a practical surface wave signal.

Points $u$, $v$, $w$ and $x$ in FIG. 7 show the thickness of the ZrO₂ film of 300 A (3/4000 λ), 700 A (7/4000 λ), 1000 A (1/400 λ) and 4000 A (1/100 λ), respectively, provided that the ratio of the dielectric constants $\epsilon_1/\epsilon_2$ is equal to 1/20 and the operating frequency is equal to 60 MHz.

A ZrO₂ film is deposited on a ceramic piezoelectric substrate by vacuum deposition technique, for example. Then an aluminum film is deposited onto the entire surface of the ZrO₂ film. Thereafter a transducer, that is inter-digital type electrodes having 90 pairs, apertures having a length of 1 mm, electrode width of 8 microns, and the electrode gap of 8 micron was formed by photo-etching technique to complete an elastic surface wave device as shown in FIG. 1. This device showed an excellent surface wave characteristic shown in FIG. 13, at an operating frequency of 60 MHz.

Figure 14:
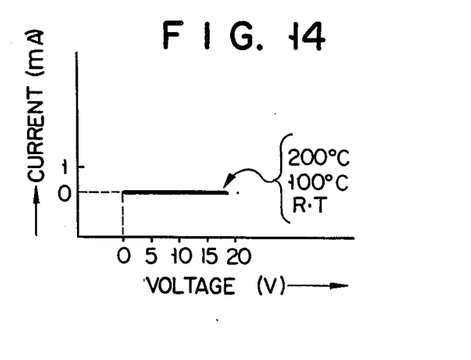
FIG. 14 shows the voltage-current characteristic of the third embodiment.

For example, with the thickness of the ZrO₂ film of 1400 A (7/2000 λ) a radiation resistance of 200 ohms was obtained, whereas with a thickness of 3400 A (34/4000 λ), a radiation resistance of 250 ohms was obtained which is higher than the radiation resistance of 50 ohms of the prior art device not provided with the ZrO₂ film. By testing this device for the voltage-current characteristic curves at a relative humidity of 70%, a curve shown in FIG. 14 was obtained. Thus, it was found that the current does not vary at room temperature RT, 100° C and 200° C. This means that the elastic surface wave device utilizing a ZrO₂ film has an excellent moisture proof characteristic so that it is not necessary to completely seal the elastic surface wave device as in the device utilizing a TiO₂ or SiO₂ dielectric film.

The elastic surface wave device of embodiment 3 utilizing a ZrO₂ dielectric film has the following advantages. 1. More particularly, ZrO₂ is more easy to evaporate than $TiO_2$, SiO and $SiO_2$ when performing vacuum deposition. Accordingly, the evaporation source of $ZrO_2$ evolves lesser amount of gas whereby the vapour deposition condition can be more easily controlled.

2. When forming an aluminum transducer on a $TiO_2$ film aluminum diffuses into the $TiO_2$ film with the result that the resistance between opposed electrodes is not infirmity but about 10 Meg Ohms. For this reason, the device is treated in an air furnace to oxidize the surface of the $TiO_2$ film for the purpose of increasing the resistance betweem electrodes to infirmity. On the other hand, with a $ZrO_2$ film, it is possible to obtain an infirmitely large interelectrode resistance only by etching technique. Accordingly, it is possible to eliminate the surface oxidizing step, thus decreasing the manufacturing cost.

3. When the chemical structure of $TiO_2$, SiO and $SiO_2$ becomes deficient of oxygen they manifest the property of semiconductors so that they can pass electric current readily. However, a $ZrO_2$ can be used as a stable dielectric film.

4. Where a $ZrO_2$ film is used it is not necessary to perfectly seal the device as that utilizing a $TiO_2$ film thereby decreasing the cost of fabrication.

5. An elastic surface wave device utilizing a $ZrO_2$ film has a lower surface wave propagation loss than those utilizing $TiO_2$, SiO and $SiO_2$ films thus exhibiting better surface wave characteristics.

6. It is possible to increase the bonding strength of thin film leads to the inter-digital type electrodes. For example, the bonding strength of aluminum lead (25 $\mu\phi$) connected by ultrasonic wave welding to an aluminum film formed on a ceramic dielectric substrate is small, for example 2 grams, but the bonding strength increases to 4 grams when a dielectric film is deposited on a ceramic piezoelectric substrate and an aluminum film is formed on the dielectric film.

A film of a metal oxide is generally formed by spattering or vapour deposition.

In each case, however, it is extremely difficult to form a stoichiometric film and in most cases films deficient in oxygen are formed. For example, a $ZrO_2$ film is deposed on a piezoelectric ceramic 30 cm spaced from a sintered body of $ZrO_2$ which is heated by an energy-gun under a partial oxygen pressure of $1 \times 10^{-4}$ torr. In this case, when the piezoeletric ceramic is heated to about 200° C, a film having a chemical structure approximating $ZrO_2$ is formed on the surface of the ceramic. However, the result of precise analysis of this film should that in addition to the major proportion of $ZrO_2$ there are also $ZrO_{1.9}$, $ZrO_{1.8}$ . . . . $ZrO$. Even when a small amount (for example 5 to 10%) of an oxide of other metal which is stable and having a large energy gap for example a metal oxide containing a plurality of oxygen atoms per one metal element such as $SiO_2$ and $Ta_2O_5$ is contained in such film of $ZrO_2$ including oxygen vacancies, a stable film can be produced. For example, when a sintered mixture of $ZrO_2$ and 5% of $Ta_2O_5$ is used as the evaporation source instead of said sintered body of $ZrO_2$, more stable film can be produced.

What we claim is:

1. An elastic surface wave device comprising a piezoelectric substrate having a dielectric constant of $\epsilon_2$, a dielectric film formed on said piezoelectric substrate and having a thickness of h and a dielectric constant of $\epsilon_1$, and an input-output transducer formed on said dielectric film, wherein the ratio of the dielectric constants $\epsilon_1/\epsilon_2$ of said piezoelectric substrate and said dielectric film, and a function $(2\pi/\lambda)\cdot h$ proportional to the thickness of said dielectric film are selected to satisfy a condition established in a frustum shaped region bounded by coordinate points $p$ ($\epsilon_1/\epsilon_2 = 1/5$, $(2\pi/\lambda)\cdot h = 0.1$), $Q(\epsilon_1/\epsilon_2 = 1/5$, $(2\pi/\lambda)\cdot h = 0.00016)$, $R(\epsilon_1/\epsilon_2 = 1/500$, $(2\pi/\lambda)\cdot h = 0.0004)$ and $S(\epsilon_1/\epsilon_2 = 1/500$, $(2\pi/\lambda)\cdot h = 0.0006)$ on a graph wherein said ratio $\epsilon_1/\epsilon_2$ is represented on the ordinate and said function $(2\pi/\lambda)\cdot h$ on the abscissa, where $\lambda$ represents the wavelength of the elastic surface wave without the dielectric film.

2. An elastic surface wave device according to claim 1, wherein the ratio of the dielectric constants $\epsilon_1/\epsilon_2$ of said piezoelectric substrate and said dielectric film, and a function $(2\pi/\lambda)\cdot h$ proportional to the thickness of said dielectric film are selected to satisfy a condition established in a parallelogram shaped region bounded by coordinate points $P$ ($\epsilon_1/\epsilon_2 = 1/5$, $(2\pi/\lambda)\cdot h = 0.1$), $Q'(\epsilon_1/\epsilon_2 = 1/5$, $(2\pi/\lambda)\cdot h = 0.006)$, $R(\epsilon_1/\epsilon_2 = 1/500$, $(2\pi/\lambda)\cdot h = 0.0004)$ and $S(\epsilon_1/\epsilon_2 = 1/500$, $(2\pi/\lambda)\cdot h = 0.0006)$ on a graph wherein said ratio $\epsilon_1/\epsilon_2$ is represented on the ordinate and said function $(2\pi/\lambda)\cdot h$ on the abscissa, where $\lambda$ represents the wavelength of the elastic surface wave without the dielectric film.

3. An elastic surface wave device according to claim 1, wherein the ratio of the dielectric constants $\epsilon_1/\epsilon_2$ of said piezoelectric substrate and said dielectric film, and a function $(2\pi/\lambda)\cdot h$ proportional to the thickness of said dielectric film are selected to satisfy a condition established in a parallelogram shaped region bounded by coordinate points $T$ ($\epsilon_1/\epsilon_2 = 1/10$, $(2\pi/\lambda)\cdot h = 6/100)$, $U(\epsilon_1/\epsilon_2 = 1/10$, $(2\pi/\lambda)\cdot h = 1/100)$, $V(\epsilon_1/\epsilon_2 = 1/50$; $(2\pi/\lambda)\cdot h = 3/1000)$ and $W(\epsilon_1/\epsilon_2 = 1/50$, $(2\pi/\lambda)\cdot h = 2/100)$ on a graph wherein said ratio $\epsilon_1/\epsilon_2$ is represented on the ordinate and said function $(2\pi/\lambda)\cdot h$ on the abscissa, where $\lambda$ represents the wavelength of the elastic surface without the dielectric film.

4. An elastic surface wave device according to claim 1 wherein said transducer comprises inter-digital type input and output electrodes, each including a plurality of pairs of conductors, and having apertures of a predetermined shape and a predetermined conductor width.

5. An elastic surface wave device according to claim 1 wherein the material of said piezoelectric substrate is selected from a group consisting of lithium niobate ($LiNbO_3$), ceramics, quartz and lithium tantalate ($LiTaO_3$), and the material of said dielectric film is selected from a group consisting of SiO, $SiO_2$, $TiO_2$, $Ta_2O_5$, $Al_2O_3$, BeO, $Cr_2O_3$, $ZrO_2$, $Ni_2O_3$, ZnO, $Y_2O_3$, CdO and $PbO_2$, and wherein various combinations of the materials of said groups are used to establish a described relation in said frustum shaped region thereby enabling said device to propagate a surface wave.

6. An elastic surface wave device comprising a ceramic piezoelectric substrate, a titanium dioxide dielectric film deposited on said piezoelectric substrate, and an interdigital type input-output tranducer formed on said titanium dioxide dielectric film for converting an elastic surface wave energy, said titanium dioxide dielectric film having a thickness of 0.00016 $\lambda$ to 0.047 $\lambda$, where $\lambda$ represents the wavelength of the elastic surface wave without the dielectric film.

7. An elastic surface wave device comprising a ceramic piezoelectric substrate, a zirconium dioxide dielectric film deposited on said piezoelectric substrate, and an inter-digital type input-output transducer formed on said zirconium dioxide dielectric film for converting an elastic surface wave, said zirconium dioxide dielectric film having a thickness of from $0.0004\lambda$ to $1/100$ $\lambda$, where $\lambda$ represents the wavelength of said elastic surface wave.

* * * * *